United States Patent
Komatsu et al.

(10) Patent No.: US 6,620,554 B1
(45) Date of Patent: Sep. 16, 2003

(54) ETCHING SUBSTRATE MATERIAL, ETCHING PROCESS, AND ARTICLE OBTAINED BY ETCHING

(75) Inventors: Takayasu Komatsu, Tokyo (JP); Daisuke Hashimoto, Tokyo (JP); Akira Makita, Tokyo (JP); Koji Fujiyama, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 09/189,977

(22) Filed: Nov. 12, 1998

(30) Foreign Application Priority Data

Nov. 13, 1997 (JP) ................................. 9-312070

(51) Int. Cl.[7] ................................. G03F 9/00
(52) U.S. Cl. ................................. 430/5; 430/6
(58) Field of Search ................................. 430/5, 6

(56) References Cited

U.S. PATENT DOCUMENTS

| | | | |
|---|---|---|---|
| 4,971,894 A | 11/1990 | Memis et al. ............... 430/323 |
| 5,127,965 A | 7/1992 | Inoue et al. ................ 148/500 |
| 5,180,322 A * | 1/1993 | Yamamoto et al. .......... 445/37 |
| 5,396,146 A * | 3/1995 | Nakamura et al. .......... 313/402 |
| 5,450,434 A * | 9/1995 | Ota et al. .................... 372/57 |
| 5,550,002 A * | 8/1996 | Kojima et al. .............. 430/258 |
| 5,605,582 A | 2/1997 | Inoue et al. ................ 148/320 |
| 5,721,090 A * | 2/1998 | Okamoto et al. ........... 430/313 |
| 5,964,942 A * | 10/1999 | Tanabe et al. ............... 117/87 |

* cited by examiner

Primary Examiner—Wayne A. Langel
Assistant Examiner—Jonas N. Strickland
(74) Attorney, Agent, or Firm—Sughrue Mion, PLLC

(57) ABSTRACT

A process of forming a high-definition pattern by etching is provided. A photosensitive resin layer is formed on a metal substrate material having a center line-average surface roughness Ra of up to 0.10 μm and a maximum surface roughness Rmax of up to 1.0 μm to form a resist pattern. Then, the photosensitive resin layer provided on the metal substrate material is exposed to light to form a resist pattern. Finally, etching is carried out to form a pattern on the metal substrate material.

2 Claims, 2 Drawing Sheets

ETCHING SUBSTRATE MATERIAL, ETCHING PROCESS, AND ARTICLE OBTAINED BY ETCHING

BACKGROUND OF THE INVENTION

The present invention relates generally to an etching substrate material and etching process used to form high-definition patterns by etching metal materials for lead frames, shadow masks, and so on. More specifically, the invention provides a process of forming a high-definition metal pattern by surface-treating a metal substrate material by rolling, chemical polishing, physical polishing or electrolytic polishing to create a very smooth surface state, and then carrying out given etching, and a metal article processed with high definition.

For a lead frame, shadow mask or aperture grill, a photosensitive resin is first coated on the surface of a metal material. Then, the photosensitive resin is exposed to light while a desired pattern is brought in vacuum close contact therewith, thereby forming a photoresist pattern. Finally, etching is performed to form apertures, holes, etc. as desired.

For metal materials for shadow masks, alloys such as iron-nickel base alloys, and iron-nickel-cobalt base alloys are generally used. Thin alloy sheets are produced by preparing an alloy ingot by a continuous casting process or an ingot-making process, and then blooming, hot-rolling or cold-rolling the ingot.

In a conventional etching process, an exposure pattern cannot be in vacuum close contact with a substrate material having too smooth a surface at an exposure step because it is very difficult to remove gases from a central area thereof by drawing a vacuum.

Thus, the surface roughness of the metal sheet used so far in the art is Ra=ca. 0.20 to 0.70 $\mu$m (center line-average surface roughness) and Rmax=ca. 2.0 to 4.0 $\mu$m (maximum surface roughness).

For a shadow mask used on a computer display for high-definition display purposes, on the other hand, it is required that apertures for transmission of electron beams be located at narrow intervals and have high precision. With this, a metal should be micro-etched with an ever higher precision.

In pattern formation, the larger the amount of etching, the more slender the influence of asperities formed on the pattern becomes. However, the smaller the amount of etching, the greater the influence of the deformation of the pattern on etching becomes.

Thus, a shadow mask used on a display with high definition is obtained by micro-processing at minute intervals. In this case, however, the amount of etching is too reduced to prevent a pattern formed on the substrate from manifesting itself remarkably due to the deformation of a resist pattern. There is a strong demand for an etching substrate material and process that enable patterns to be formed with an ever higher definition.

One object of the invention is to provide an etching substrate material which enables a precisely shaped resist pattern to be formed thereon by etching. Another object of the invention is to provide a method of processing metals with high definition and producing a metal article processed with high definition. Yet another object of the invention is to provide a method of producing a high-definition processed metal article, e.g., a shadow mask, an aperture grill, and a lead frame.

SUMMARY OF THE INVENTION

Figure 1:
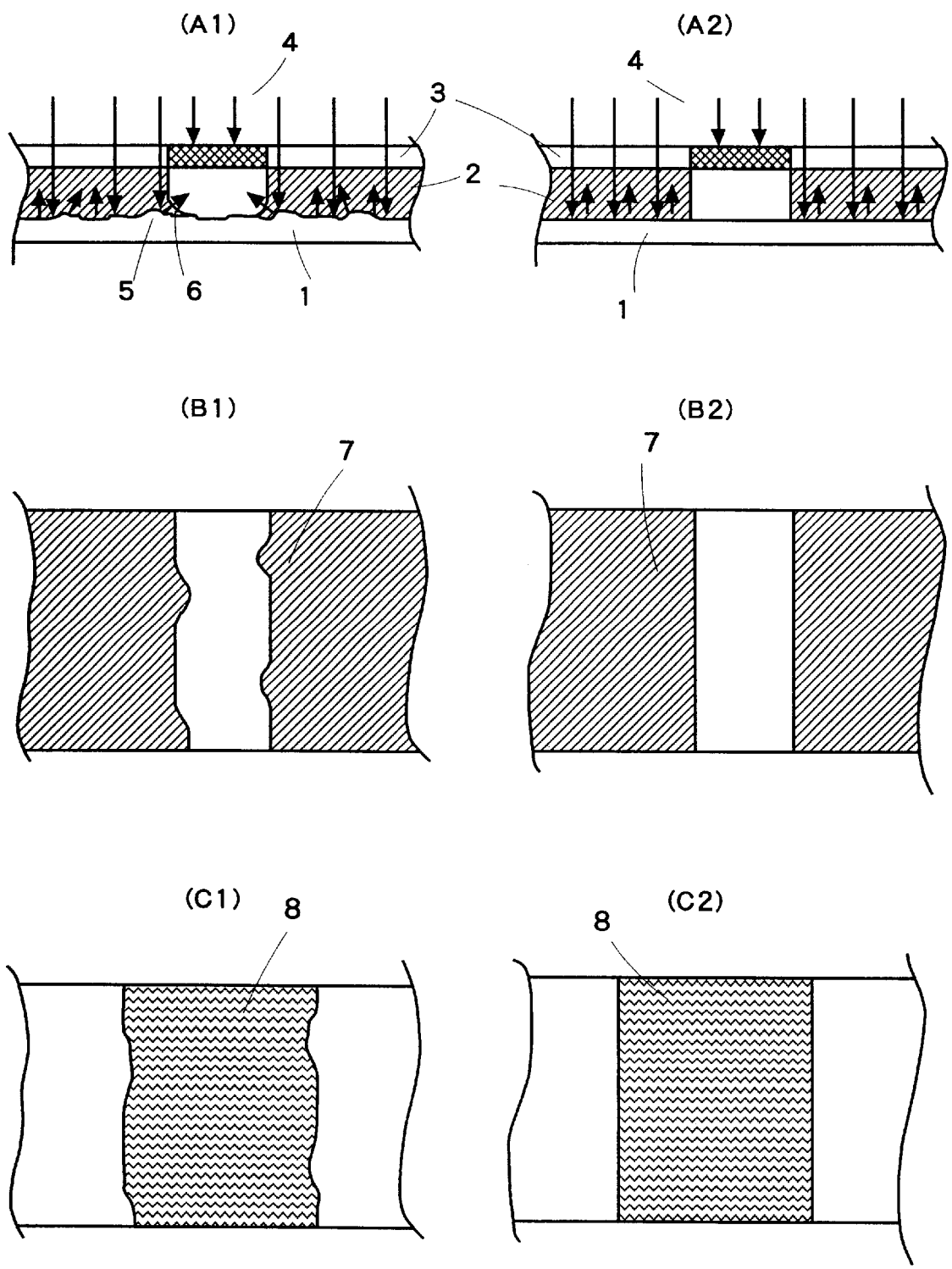
FIGS. 1(A1), 1(A2), 1(B1), 1(B2), 1(C1), and 1(C2) illustrate a specific relationship between the surface roughness of a substrate material and the pattern formed on the substrate material.

The present invention provides an etching substrate material comprising a metal substrate material which is to be provided thereon a pattern by coating a photosensitive resin layer formed thereon, and exposing the photosensitive resin layer to light to form a resist pattern, followed by etching, characterized in that said etching substrate material has a center line-average surface roughness Ra of up to 0.10 $\mu$m and a maximum surface roughness Rmax of up to 1.0 $\mu$m.

Preferably, the surface roughness of the metal substrate material has been regulated by at least one of rolling, chemical polishing, physical polishing, and electrolytic polishing.

Preferably, the metal substrate material is a substrate material for a shadow mask, an aperture grill or a lead frame.

The present invention also provides an etching process of exposing to light a photosensitive resin layer formed on a metal substrate material to form a resist pattern thereon, and carrying out etching to form a pattern on said metal substrate material, characterized in that said photosensitive resin layer is formed on a metal substrate material having a center line-average surface roughness Ra of up to 0.10 $\mu$m and a maximum surface roughness Rmax of up to 1.0 $\mu$m to form a resist pattern, followed by etching.

Further, the present invention provides an etching process of exposing to light a photosensitive resin layer formed on a metal substrate material to form a resist pattern thereon, and carrying out etching to form a pattern on said metal substrate material, characterized in that after degreasing of said metal substrate material, said metal substrate material is surface-treated with a first etchant to regulate a center line-average surface roughness Ra and a maximum surface roughness Rmax to up to 0.10 $\mu$m and up to 1.0 $\mu$m, respectively, and a photosensitive resin layer is thereafter formed and developed on said metal substrate material to form a resist pattern thereon, followed by etching.

Preferably, the first etchant comprises an aqueous solution of ferric chloride having at least 50° Bh (Baumé degree).

Preferably, the metal substrate material is a substrate material for a shadow mask, an aperture grill or a lead frame.

Furthermore, the present invention provides an article obtained by exposing to light a photosensitive resin layer formed on a metal substrate material to form a resist pattern, followed by etching, characterized in that said metal substrate material has a center line-average surface roughness Ra of up to 0.10 $\mu$m and a maximum surface roughness Rmax of up to 1.0 $\mu$m.

The article obtained by etching is a shadow mask or an aperture grill.

DESCRIPTION OF THE PREFERRED EMBODIMENT

The present invention enables a high-definition photoresist pattern to be formed on the surface of a substrate material by making the surface roughness of the substrate material used for etching lower than that of a conventional substrate material.

For micro-processing, it is required to form a resist pattern with excellent definition. Never until now, however, is the surface roughness of a substrate material considered to be a factor detrimental to the achievement of this. The present invention will now be explained with reference to the accompanying drawings.

FIGS. 1(A1), 1(A2), 1(B1), 1(B2), 1(C1), and 1(C2) illustrate a specific relationship between the surface roughness of a substrate material and the pattern formed on the substrate material.

FIGS. 1(A1), 1(B1), and 1(C1) are views for illustrating a process of forming a pattern by an etching technique, and FIGS. 1(A2), 1(B2), and 1(C2) are views for illustrating a process of forming a pattern by an etching technique.

First consider the case where, as shown in the sectional view of FIG. 1(A1), a photosensitive resin 2 is coated on a substrate material 1 having a large surface roughness and the resin layer is exposed to ultraviolet radiation 4 while an image pattern 3 is in close contact therewith. At an area of the substrate material having a large surface roughness, the pattern shape is deformed, shown at 6, by the diffraction effect of local light caused by asperities 5, resulting in a drop of the resolution of the pattern. As can be seen from FIG. 1(A2), however, a substrate material having a small surface roughness enables an undeformed pattern to be obtained thereon.

FIGS. 1(B1) and 1(B2) are plan views of linear patterns formed on substrate materials. On one substrate material having a large surface roughness, a resist pattern 7 is deformed or is not in an accurate linear form, as can be seen from FIG. 1(B1). On another substrate material having a small surface roughness, however, a linear pattern is obtainable as can be seen from FIG. 1(B2).

FIGS. 1(C1) and 1(C2) show the shapes of such patterns upon etching. An aperture pattern 8 obtained by etching has asperities as can be seen from FIG. 1(C1). This aperture pattern has difficulty in application to a shadow mask, because it is difficult to provide accurate electron beam irradiation due to the presence of the asperities. When an accurate resist pattern is obtained, however, it is possible to form an accurate aperture pattern as can be seen from FIG. 1(C2).

Figure 2:
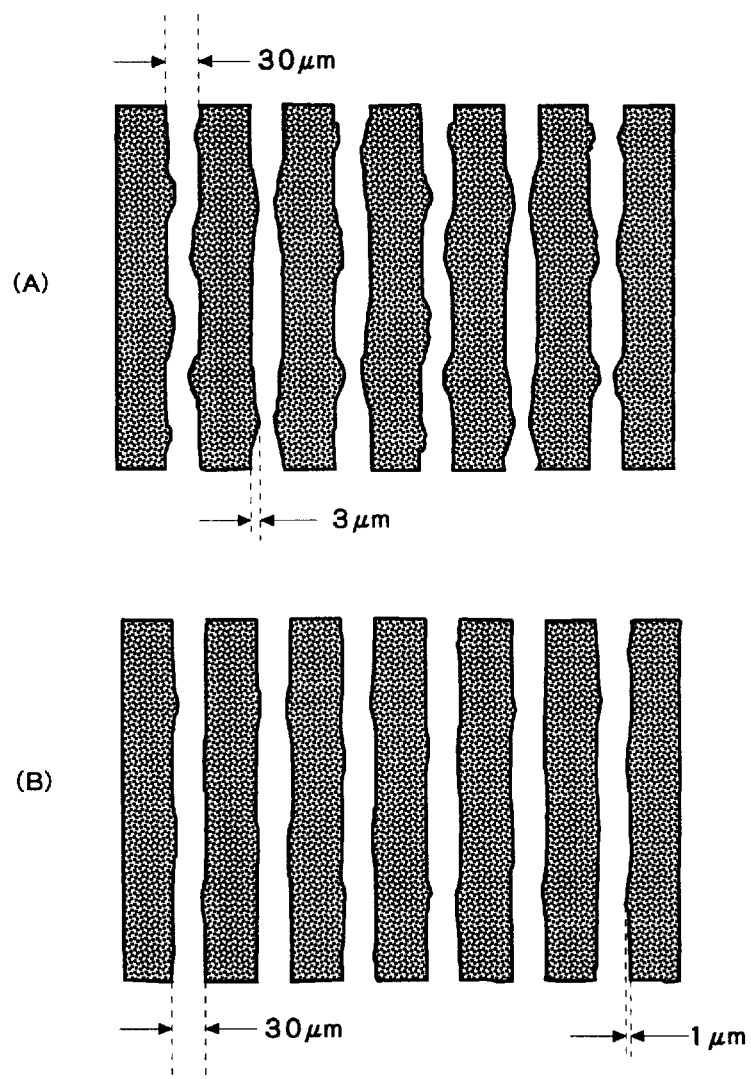
FIGS. 2(A) and 2(B) illustrate a specific relationship between the accuracy of the pattern and transmittance.

FIGS. 2(A) and 2(B) show specific relationships between the accuracy of patterns and transmittance.

Here consider an aperture grill with a pitch of 150 $\mu$m and an aperture of 30 $\mu$m. This aperture grill has a transmittance of 20%. When 3 $\mu$m deformations are found on both ends of a tape portion as shown in FIG. 2(A), a local transmittance drop of as large as 20% occurs. Consequently, when this aperture grill is used on a cathode-ray tube, some considerable image quality degradation is found. When the amount of deformation is about 1.0 $\mu$m as shown in FIG. 2(B), on the other hand, the local transmittance drop is limited to about 10%, resulting in substantial prevention of such image quality degradation.

This is also true of a linearity difference. When an aperture grill has a pitch of 300 $\mu$m and an aperture of 60 $\mu$m, the local transmittance difference is 10%, and 5%, respectively, between which any noticeable image quality difference is not found.

When an aperture grill or shadow mask is fabricated with higher definition, the edge linearity of an aperture pattern upon etching is a very important factor for CRT image quality. The finer the pitch and the smaller the aperture size, the higher the degree of definition becomes. In this case, however, a minute size difference between asperities on the edge area is largely reflected on image quality.

The substrate material of the invention may be produced by a process wherein the surface of a steel sheet obtained by the rolling of a steel ingot is regulated to a given surface roughness by means of rolls each having a regulated surface roughness, and a process wherein the surface of a steel sheet upon rolling is polished by physical polishing using abrasives, chemical polishing, electrolytic polishing or the like. In the physical polishing process, use may be made of buffing, a roll polishing material, and a film polishing material, among which preference is given to the roll or film polishing material because powders and particles are unlikely to pass into the next step.

When the surface roughness is regulated by use of an etchant, the concentration of the etchant used can be higher than that of an etchant used for the formation of a pattern by etching. For instance, a ferric chloride solution having a high concentration of at least 50° Bh may be used.

For the substrate material of the invention, for instance, iron-nickel base alloys, iron-nickel-cobalt base alloys, low-carbon steel may be used.

The surface roughness of the substrate material according to the present invention has preferably a center line-average roughness Ra of up to 0.10 $\mu$m and a maximum roughness Rmax of up to 1.0 $\mu$m as measured by a probe type shape measuring device (e.g., Tarysurf 6 made by Rank Taylor Hobson Co., Ltd.). For pattern formation, it is preferred that both Ra and Rmax be small. When the center line-average roughness Ra is greater than 0.10 $\mu$m or the maximum roughness Rmax is greater than 1.0 $\mu$m, any satisfactory pattern linearity is not obtainable. A drop of pattern linearity may often cause a quality drop of a shadow mask or aperture grill, and so may make it impossible to obtain any high-definition shadow mask or aperture grill.

In a conventional etching process, an exposure pattern cannot be in vacuum close contact with a substrate material having too smooth a surface at an exposure step because it is very difficult to remove gases from a central area thereof by drawing a vacuum. Thus, the surface roughness of the metal sheet used is Ra=ca. 0.20 to 0.70 $\mu$m and Rmax=ca. 2.0 to 4.0 $\mu$m. A poor contact problem with the vacuum close contact may be solved by use of a device disclosed by the inventors in JP-A's 3-265835, 3-265836, and 3-265837. That is, pressures on both sides of an exposure pattern are reduced by means of two independently located vacuum chambers whose pressures are controllable, so that the exposure pattern can be brought in close contact with the substrate material from its center due to a difference in the pressures on both sides thereof, thereby preventing gases from remaining in the central area of the exposure pattern, and forming a space.

EXAMPLE

The present invention will now be explained with reference to the following examples.

Example 1

0.10 mm thick substrate samples 1 and 2 varying in surface roughness were obtained by cold-rolling. After degreasing and water washing of the surface of each sample, casein photoresist containing 1% by weight of ammonium bichromate was coated and dried thereon at a post-drying thickness of 5 μm.

Then, a linear pattern having an array of 15 μm apertures was exposed to light while it was in close contact with the photoresist using a photomask, and developed. Following this, the sample was dipped in a 1% by weight bichromic acid solution, washed with water, and heated at 200° C. for 1 minute.

Then, a 5 μm deep etching was carried out by spraying of a ferric chloride solution.

The surface roughness of sample 1 was found to be Ra=0.20 μm and maximum roughness Rmax=2.0 μm as measured by a probe type shape measuring device (Tarysurf 6 made by Rank Taylor Hobson Co., Ltd.). Likewise, the surface roughness of sample 2 was found to be Ra=0.06 μm and maximum roughness Rmax=0.8 μm.

Figure 3:
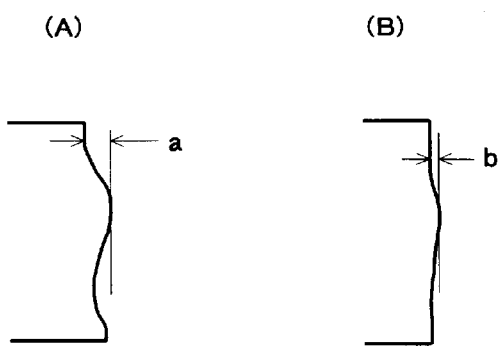
FIGS. 3(A) and 3(B) illustrate a pattern fabricated by the process of the invention, and a comparative pattern.

The surface shape of each pattern obtained by etching was observed under an electron microscope. The results are shown in FIG. 1 that are plan views of the asperities of the patterns. Sample 1 has an asperity of a=3.0 μm as shown in FIG. 3(A), and sample 2 has an asperity of b=1.1 μm as shown in FIG. 3(B).

Example 2

Substrate samples 3 and 4, having a thickness of 0.030 mm and varying in surface roughness, were obtained from an iron-nickel base alloy (Invar alloy) by cold-rolling. As in Example 1, etching was carried out by spraying a ferric chloride solution onto both sides of each sample, thereby forming an array of apertures of 20 μm in width.

The surface roughness of sample 3 was found to be Ra=0.50 μm and maximum roughness Rmax=3.2 μm as measured as in Example 1. Likewise, the surface roughness of sample 4 was found to be Ra=0.09 μm and maximum roughness Rmax=0.9 μm. The surface shape of each pattern was observed under an electron microscope. The results are shown in FIG. 1 that are plan view of the asperities of the patterns. Sample 3 has an asperity of a=3.4 μm as in FIG. 3(A), and sample 4 has an asperity of b=1.3 μm as in FIG. 3(B).

Example 3

Sample 1 in Example 1 was degreased, and then surface-treated at 40° C. for 2 minutes, using a ferric chloride solution of 51° Bh. Following this, etching was carried out under such conditions as in Example 1 to form a pattern. The surface shape of the pattern was measured as in Example 1. A linear shape of an area opened by etching has an asperity of b=1.4 μm as in FIG. 3(B).

Example 4

Sample 1 in Example 1 was degreased, and then surface-treated by buffing with alumina powders of 1 μm in particle size, thereby obtaining a surface roughness as represented by Ra=0.06 μm. Following this, etching was carried out under such conditions as in Example 1 to form a pattern. The surface shape of the pattern was measured as in Example 1. A linear shape of an area opened by etching has an asperity of b=1.2 μm as in FIG. 3(B).

As explained in the foregoing, the surface roughness of the etching substrate material is regulated to a given range of roughness by the process of the invention, whereby a photosensitive resin pattern formed on the etching substrate material can be accurately shaped. It is thus possible to obtain a high-quality shadow mask for high-definition displaying purposes, etc.

What we claim is:

1. An article obtained by exposing to light a photosensitive resin layer formed on a metal substrate material to form a resist pattern, followed by etching, wherein said metal substrate material has a center line-average surface roughness Ra of less than 0.10 μm and a maximum surface roughness Rmax of less than 1.0 μm.

2. The article according to claim 1, wherein said article is a shadow mask or an aperture grill.

* * * * *